(12) United States Patent
Kanda et al.

(10) Patent No.: US 7,279,768 B2
(45) Date of Patent: Oct. 9, 2007

(54) SEMICONDUCTOR DEVICE FOR OVERVOLTAGE PROTECTION

(75) Inventors: Ryo Kanda, Gunma (JP); Shuichi Kikuchi, Gunma (JP); Seiji Otake, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 39 days.

(21) Appl. No.: 11/361,173

(22) Filed: Feb. 23, 2006

(65) Prior Publication Data

US 2006/0186507 A1   Aug. 24, 2006

(30) Foreign Application Priority Data

Feb. 24, 2005   (JP) ............................. P2005-049006

(51) Int. Cl.
*H01L 23/58* (2006.01)
(52) U.S. Cl. ............ 257/491; 257/487; 257/490; 257/E29.014; 257/E29.023
(58) Field of Classification Search ............... None
See application file for complete search history.

(56) References Cited

U.S. PATENT DOCUMENTS

2004/0031987 A1* 2/2004 Henninger et al. ......... 257/328

FOREIGN PATENT DOCUMENTS

JP        10-506503        6/1998

\* cited by examiner

*Primary Examiner*—Evan Pert
*Assistant Examiner*—Scott R. Wilson
(74) *Attorney, Agent, or Firm*—Fish & Richardson P.C.

(57) ABSTRACT

In a semiconductor device of the present invention, an N-type buried diffusion layer is formed across a substrate and an epitaxial layer. A P-type buried diffusion layer is formed across an upper surface of the N-type buried diffusion layer over a wide range to form a PN junction region for an overvoltage protection. A P-type diffusion region is formed so as to be connected to the P-type buried diffusion layer. A breakdown voltage of the PN junction region is lower than a breakdown voltage between a source and a drain. This structure makes it possible to prevent a concentration of a breakdown current and protect the semiconductor device from an overvoltage.

4 Claims, 8 Drawing Sheets

—— Having overvoltage protection structure
----- Having no overvoltage protection structure

SEMICONDUCTOR DEVICE FOR OVERVOLTAGE PROTECTION

Priority is claimed to Japanese Patent Application Number JP2005-049006 filed on Feb. 24, 2005, the disclosure of which is incorporated herein by reference in its entirety.

BACKGROUND OF THE INVENTION

1. Field of the Invention

The present invention relates to a semiconductor device that protects a circuit element from an overvoltage.

2. Description of the Related Art

In conventional semiconductor devices, for example, an N-type epitaxial layer is deposited on a P-type semiconductor substrate in order to form an N-channel LDMOS transistor. A P-type diffusion region, which is used as a back gate region, is formed on the epitaxial layer. An N-type diffusion region, which is used as a source region, is formed on the P-type diffusion layer. Moreover, an N-type diffusion layer, which is used as a drain region, is formed on the epitaxial layer. Then, an N-type buried region, which is placed below the drain region, is formed across the semiconductor substrate and the epitaxial layer. At this time, a breakdown voltage of a PN junction region, which is formed of the buried region and the semiconductor substrate, is set to be lower than a breakdown voltage between the source and the drain of the LDMOS transistor. Even when an overvoltage by which the LDMOS transistor is destroyed is applied to a drain electrode, the PN junction formed of the buried region and the semiconductor substrate breaks down by this structure. As a result, it is possible to prevent the LDMOS transistor from being destroyed by the overvoltage. This technology is described in Published Japanese Patent Translations of PCT International Publications for Patent Applications No. 10-506503 (pages 4 to 5, 7, and FIGS. 1 to 2).

As mentioned above, in the conventional semiconductor devices, the N type buried region is formed below the drain region in order to prevent the LDMOS transistor from being destroyed by the overvoltage applied to the drain region. The N-type buried region is formed to have substantially an equal width to that of the drain region. This structure causes a breakdown current to concentrate on the PN junction region of the N-type buried region and the P-type semiconductor substrate when the overvoltage is applied to the drain region and the PN junction breaks down. This leads to a problem in which the PN junction region is destroyed by a current concentration and heat caused by the concentration.

Moreover, in the conventional semiconductor device, the N-type buried region is formed in a wide range in order to make it possible to prevent the current concentration on the PN junction region. The conventional semiconductor devices here aim to improve a withstand voltage characteristic using a known RESURF principle. For this reason, the N-type buried region is largely formed so as to extend to an isolation region. While, the N-type buried region is formed additionally in the LDMOS transistor in order to form the PN junction region. Namely, when the N-type buried region is formed in the wide range, a space between the drain region and the isolation region is increased to expand an ineffective region where no element is formed. This causes a problem in which an element forming region cannot be efficiently formed with respect to a chip size.

Furthermore, in the conventional semiconductor devices, the P-type semiconductor substrate is used and the PN junction region is formed of the N-type buried region and the P-type semiconductor substrate. This structure causes the overvoltage to be applied to the drain region, so that a generating breakdown current flows to the semiconductor substrate. Accordingly, for example, the breakdown current flows thereto, thereby an electric potential of the semiconductor substrate set in a ground state is increased. In other words, since the semiconductor substrate is used as a flow path for the breakdown current, there are problems in which other elements formed on the same substrate cause an erroneous operation by the increase in the substrate potential and a latch-up phenomenon occurs.

SUMMARY OF THE INVENTION

The present invention was made in view of the aforementioned circumstances, a semiconductor device of the present invention includes a semiconductor substrate of one conductivity type; an epitaxial layer of an opposite conductivity type formed on the semiconductor substrate; a buried diffusion layer of an opposite conductivity type formed across the semiconductor substrate and the epitaxial layer; a buried diffusion layer of one conductivity type, which is formed on the buried diffusion layer of the opposite conductivity type and which has a first junction region with the buried diffusion layer of the opposite conductivity type; a first diffusion layer of one conductivity type, which is formed in the epitaxial layer and which is used as a back gate region; a first diffusion layer of an opposite conductivity type, which is formed in the first diffusion layer of the one conductivity type and which is used as a source region a gate oxide film and a gate electrode formed on the epitaxial layer; a second diffusion layer of an opposite conductivity type, which is formed in the epitaxial layer, which is used as a drain region, and which has a second junction region with the first diffusion layer of the one conductivity type; and a third diffusion layer of an opposite conductivity type, which is formed on the epitaxial layer and which is electrically connected to the second diffusion layer of the opposite conductivity type in the epitaxial layer, wherein a breakdown voltage of the first junction region is lower than a breakdown voltage of the second junction region. Accordingly, in the present invention, when an overvoltage is applied to the diffusion layer used as the drain region, the first junction region breaks down prior to the second junction region. This structure makes it possible to prevent the semiconductor device from being destroyed by the applied overvoltage.

Moreover, in the semiconductor device of the present invention, a second diffusion layer of one conductivity type connected to the buried diffusion layer of the one conductivity type is formed on the epitaxial layer. Accordingly, in the present invention, the first diffusion layer of the one conductivity type used as the back gate region and the buried diffusion layer of the one conductivity type are connected to each other through the second diffusion layer of the one conductivity type. This structure makes it possible to apply a back gate voltage to the diffusion layer of the one conductivity type and miniaturize an element size. In addition, a current path for a breakdown current and a current path for the semiconductor device are made to be apart from each other, thereby making it possible to prevent a deterioration of an element characteristic.

Furthermore, in the semiconductor device of the present invention, the first diffusion layer of the one conductivity type and the second diffusion layer of the opposite conductivity type are formed on the second diffusion layer of the one conductivity type. Accordingly, in the present invention, the buried diffusion layer of the opposite conductivity type can be formed below an element forming region over a wide range. This structure makes it possible to form the first junction region over a wide range without increasing an inactive region.

Still furthermore, in the semiconductor device of the present invention, the first diffusion layer of the one conductivity type and the second diffusion layer of the opposite conductivity type are alternately and repeatedly formed on the second diffusion layer of the one conductivity type. Accordingly, in the present invention, it is possible to prevent the semiconductor device from being destroyed by the overvoltage even in a structure in which the first diffusion layer of the one conductivity type, which is used as the back gate region where the source region is formed, and the second diffusion layer of the opposite conductivity type, which is used as the drain region, are alternately and repeatedly formed.

DETAILED DESCRIPTION OF THE PREFERRED EMBODIMENTS

The following will specifically explain a semiconductor device according to an embodiment of the present invention with reference to FIGS. 1 to 5.

Figure 1:
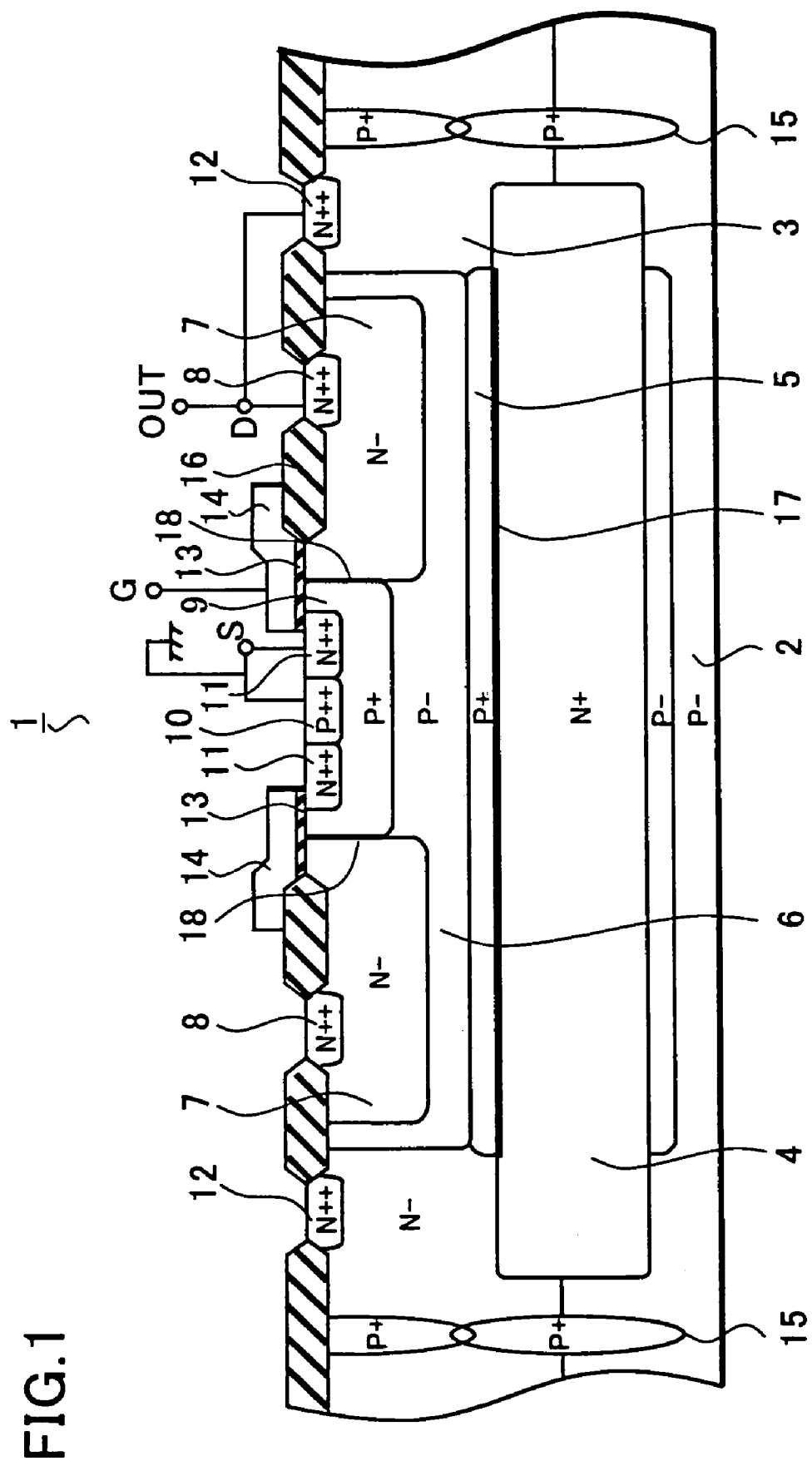
FIG. 1 is a cross-sectional view explaining a semiconductor device according to an embodiment of the present invention.
Figure 2A:
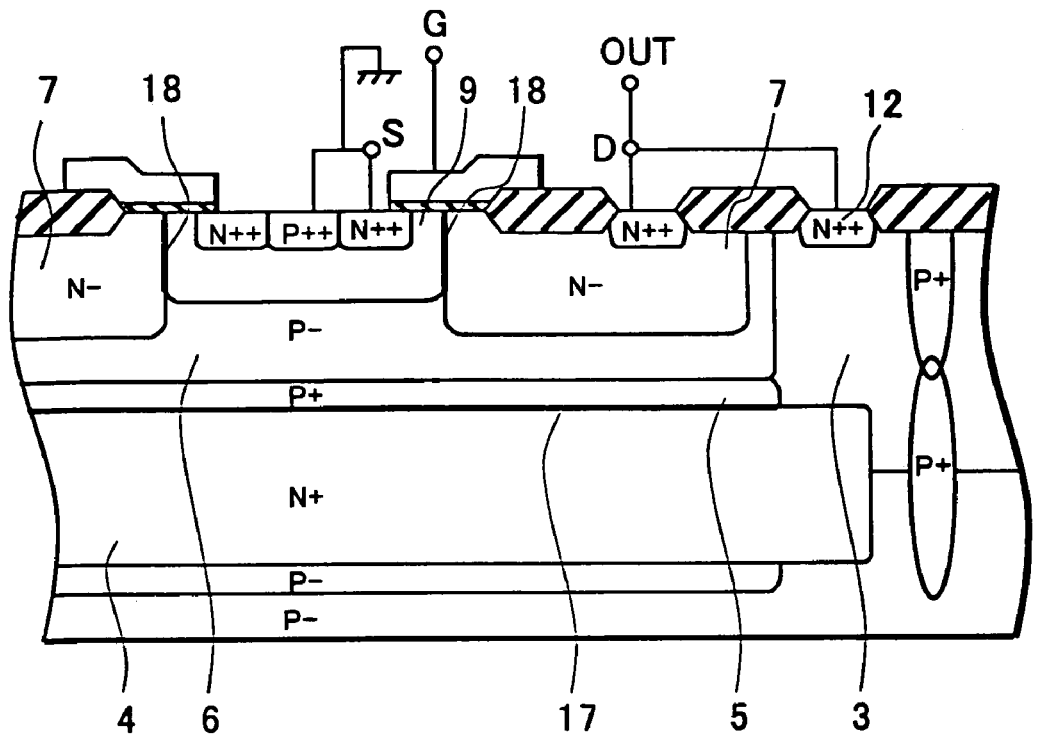
FIG. 2A is a cross-sectional view explaining a case where an overvoltage protection structure is provided in connection with the semiconductor device according to the embodiment of the present invention.
Figure 2B:
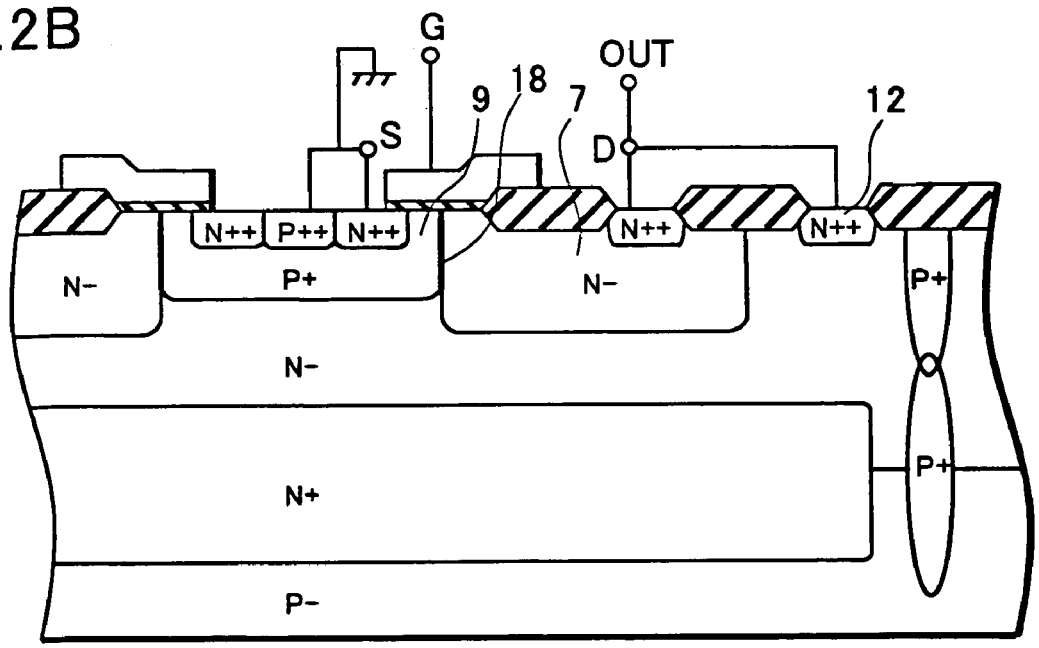
FIG. 2B is a cross-sectional view explaining a case where no overvoltage protection structure is provided in connection with the semiconductor device according to the embodiment of the present invention.
Figure 3A:
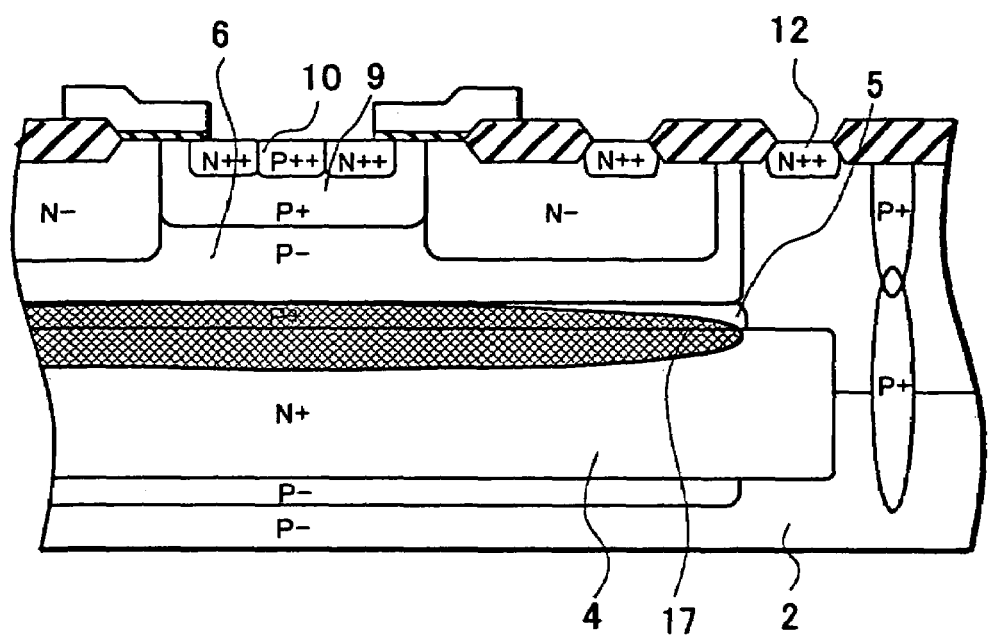
FIG. 3A is a view explaining a region in which an impact ionization generates in a case where the overvoltage protection structure is provided in connection with the semiconductor device according to the embodiment of the present invention.
Figure 3B:
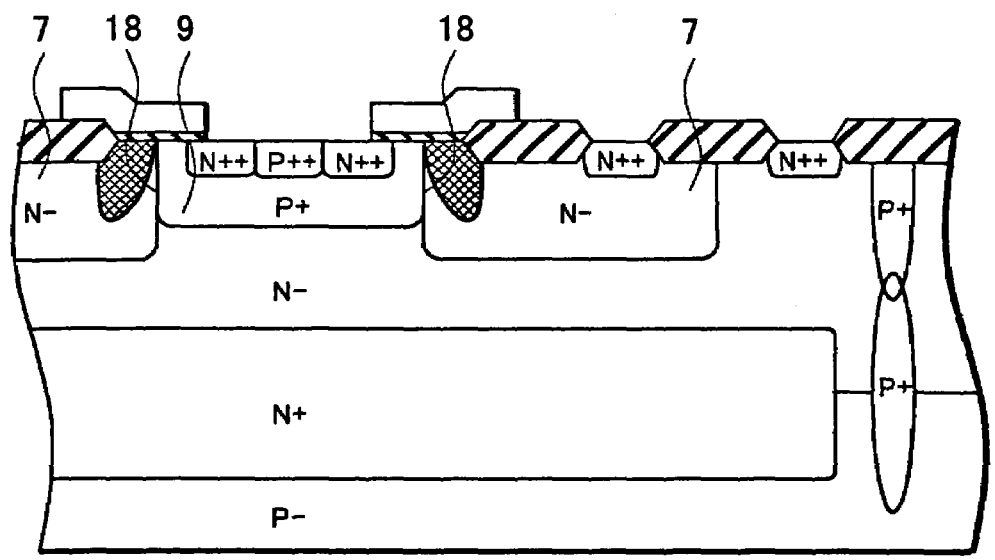
FIG. 3B is a view explaining the region in which the impact ionization generates in a case where no overvoltage protection structure is provided in connection with the semiconductor device according to the embodiment of the present invention.
Figure 4:
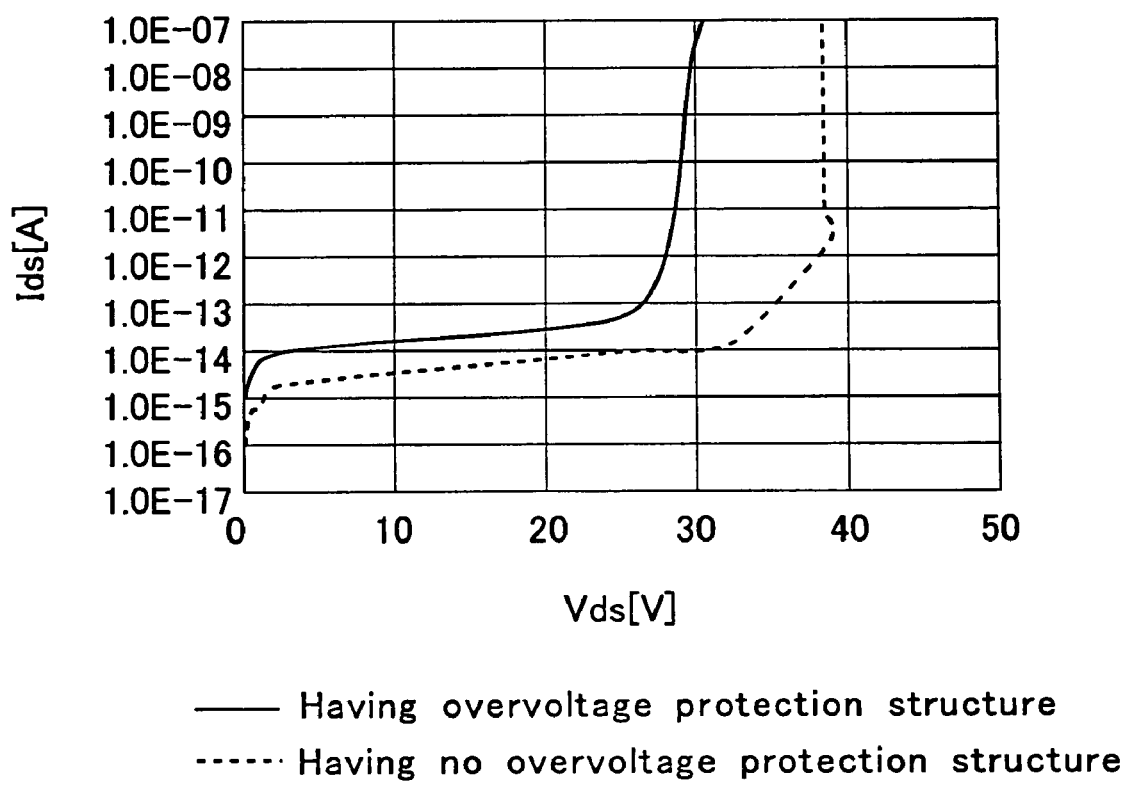
FIG. 4 is a view explaining a relationship between a current value between a source and a drain of the semiconductor device according to the embodiment of the present invention and a voltage value between the source and the drain thereof
Figure 5:
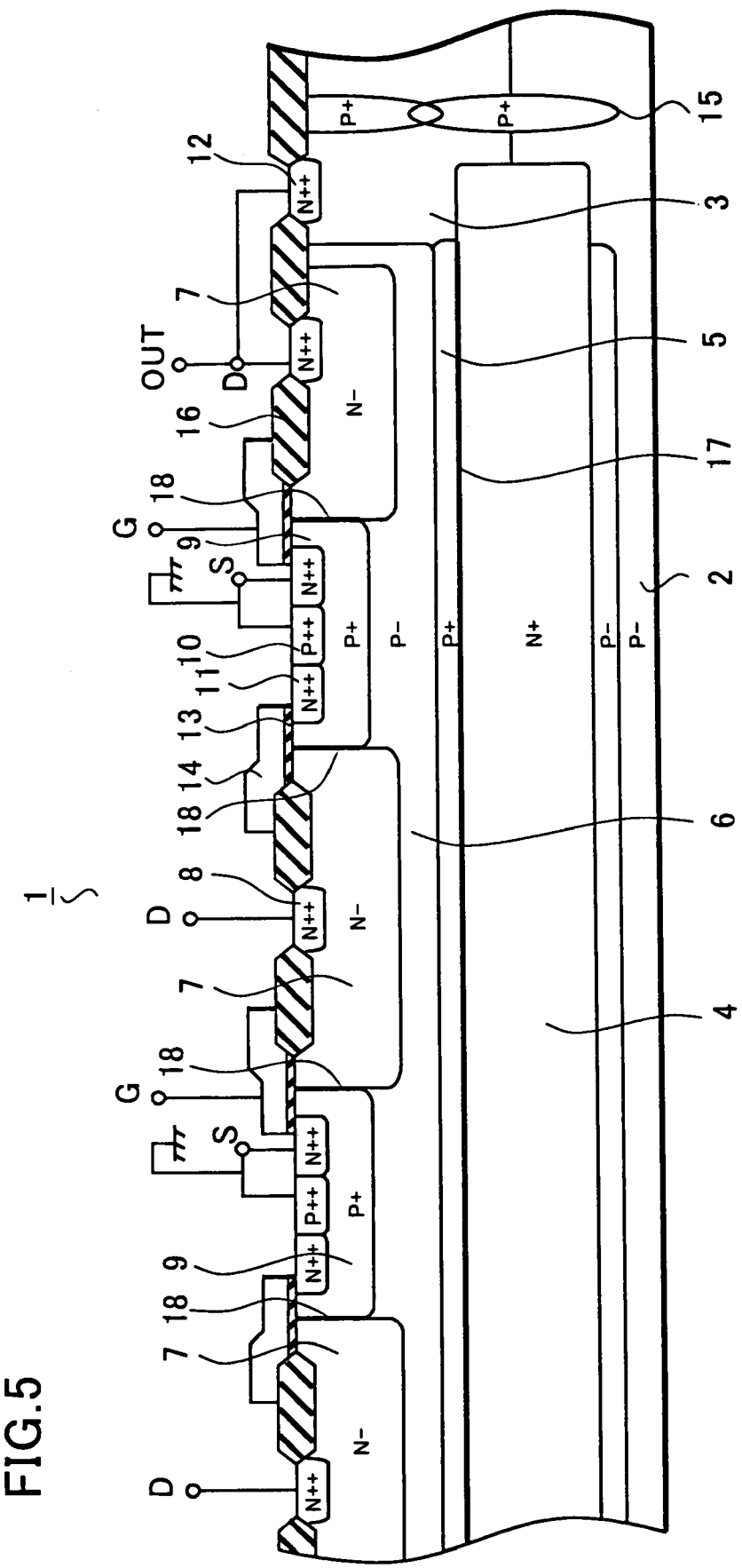
FIG. 5 is a cross-sectional view explaining the semiconductor device according to the embodiment of the present invention.

FIG. 1 is a cross-sectional view explaining a semiconductor device according to an embodiment of the present invention. FIG. 2A is a cross-sectional view illustrating the semiconductor device having an overvoltage protection structure. FIG. 2B is a cross-sectional view illustrating the semiconductor device having no overvoltage protection structure. FIG. 3A is a view explaining a region in which an impact ionization generates in the semiconductor device having the overvoltage protection structure. FIG. 3B is a view explaining a region in which an impact ionization generates in the semiconductor device having no overvoltage protection structure. FIG. 4 is a view illustrating a comparison in an element characteristic between the semiconductor device having the overvoltage protection structure and the semiconductor device having no overvoltage protection structure. FIG. 5 is a cross-sectional view explaining the semiconductor device according to the embodiment of the present invention.

As illustrated in FIG. 1, an N-channel LDMOS transistor 1 mainly includes a P-type single crystal silicon substrate 2, an N-type epitaxial layer 3, an N-type buried diffusion layer 4, a P-type buried diffusion layer 5, a P-type diffusion layer 6, N-type diffusion layers 7 and 8 used as drain regions, P-type diffusion layers 9 and 10 used as back gate regions, an N-type diffusion layer 11 used as a source region, an N-type diffusion layer 12, a gate oxide film 13, and a gate electrode 14.

The N-type epitaxial layer 3 is deposited on an upper surface of the P-type single crystal silicon substrate 2. It is noted that the present embodiment shows a case in which the one epitaxial layer 3 is formed on the substrate but the present embodiment is not limited to this case. For example, there may be a case where multiple epitaxial layers are formed on the upper surface of the substrate.

The N-type buried diffusion layer 4 is formed on both regions of the substrate 2 and the epitaxial layer 3. The N-type buried diffusion layer 4 is formed by diffusing, for example, an antimony (Sb). As illustrated in this figure, the N-type buried diffusion layer 4 is formed across a forming region for the LDMOS transistor 1, which is divided by an isolation region 15. It is noted that the N-type buried diffusion layer 4 of the present embodiment corresponds to "a buried diffusion layer of an opposite conductivity type" of the present invention.

The P-type buried diffusion layer 5 is formed on the substrate 2 and the epitaxial layer 3 in such a way to be led from upper and lower surfaces of the N-type buried diffusion layer 4. The P-type buried diffusion layer 5 is formed by diffusing, for example, a boron (B). It is noted that the present embodiment shows a case in which the boron (B) is used as P-type impurities but the present embodiment is not limited to this case. The P-type buried diffusion layer 5 may be led from the upper surface of the N-type buried diffusion layer 4 and if a diffusion coefficient of the P-type impurities is higher than that of N-type impurities, a design change can be arbitrarily made. Moreover, the P-type buried diffusion layer 5 of the present embodiment corresponds to "a buried diffusion layer of one conductivity type" of the present invention.

The P-type diffusion layer 6 is formed on the epitaxial layer 3 in such a way to be connected to the P-type buried diffusion layer 5. In the P-type diffusion layer 6, a source region, a drain region and a back gate region of the LDMOS transistor 1 are formed. The P-type diffusion layer 6 is connected to the P-type buried diffusion layer 5, thereby allowing a back gate potential to be applied to the P-type buried diffusion layer 5. This structure eliminates a need for separately forming a diffusion layer for applying an electric potential to the P-type buried diffusion layer 5. It is noted that the P-type diffusion layer 6 of the present embodiment corresponds to "a second diffusion layer of one conductivity type" of the present invention.

The N-type diffusion layers 7 and 8 are formed in the P-type diffusion layer 6. The N-type diffusion layers 7 and 8 are used as the drain regions to form a double diffusion structure. The N-type diffusion layers 7 and 8 are formed in an annular shape to surround the P-type diffusion layer 9. It is noted that the N-type diffusion layer 7 of the present embodiment corresponds to "a second diffusion layer of an opposite conductivity type" of the present invention.

The P-type diffusion layers 9 and 10 are formed in the P-type diffusion layer 6. The P-type diffusion layer 9 is used as the back gate region and the P-type diffusion layer 10 is used as a back gate leading region. It is noted that the P-type diffusion layer 9 of the present embodiment corresponds to "a first diffusion layer of one conductivity type" of the present invention.

The N-type diffusion layer 11 is formed on the P-type diffusion layer 9. The N-type diffusion layer 11 is used as the source region. The N-type diffusion layer 11 is formed in such a way to surround the P-type diffusion layer 10. The P-type diffusion layer 9, which is positioned between the N-type diffusion layer 7 and the N-type diffusion layer 11, is used as a channel region. Then, a source electrode comes in contact with the P-type diffusion layer 10 and the N-type diffusion layer 11. Namely, a source and a back gate potential, which is an equal potential to a source potential, is applied to the P-type diffusion layer 10. Additionally, in the present embodiment, the source potential and the back gate potential are ground potentials. Moreover, the N-type diffusion layer 11 of the present embodiment corresponds to "a first diffusion layer of an opposite conductivity type" of the present invention.

The N-type diffusion layer 12 is formed on the epitaxial layer 3 between the P-type diffusion layer 6 and the P-type isolation layer 15. The N-type diffusion Layer 12 is connected to an output pad to which the N-type diffusion layer 8 is connected by wiring above the epitaxial layer 3. This structure causes a drain potential to be applied to the N-type diffusion layer 12. Moreover, as illustrated in the figure, the N-type buried diffusion layer 4 is formed below the N-type diffusion layer 12 while interposing the N-type epitaxial layer 3 therebetween. The drain potential is applied to the N-type buried diffusion layer 4 through the N-type diffusion layer 12. The N-type diffusion layer 12 of the present embodiment corresponds to "a third diffusion layer of an opposite conductivity type" of the present invention.

The gate oxide film 13 is formed on a surface of the epitaxial layer 3 where the back gate region and the like are formed.

The gate electrode 14 is formed on the gate oxide film 13. The gate electrode 14 is formed of, for example, a polysilicon film, a tungsten silicon, etc., to have a desired film thickness.

Finally, in a desired region of the epitaxial layer 3, a LOCOS (Local Oxidation of Silicon) oxide film 16 is formed. Although not illustrated, an insulation layer such as a BPSG (Boron Phospho Silicate Glass) film, an SOG (Spin On Glass) film, etc., is formed on an upper surface of the epitaxial layer 3.

Next, as illustrated by a thick solid line in the figure, a PN junction layer 17 of the N-type buried diffusion layer 4 and the P-type buried diffusion layer 5 is formed below a region where the LDMOS transistor 1 is formed. As mentioned above, the drain potential is applied to the N-type buried diffusion layer 4 through the N-type diffusion layer 12 and the epitaxial layer 3. On the other hand, the back gate potential is applied to the P-type buried diffusion layer 5 through the P-type diffusion layers 6, 9 and 10. Namely, a reverse bias is applied to the PN junction region 17, which is in an open state when the LDMOS transistor 1 is normally operated. It is noted that the PN junction region 17 of the present embodiment corresponds to "a first junction region" of the present invention.

Furthermore, as illustrated by a thick solid line in the figure, a PN junction layer 18 of the N-type diffusion layer 7 and the P-type diffusion layer 9 is formed in the region where the LDMOS transistor 1 is formed. The drain potential is applied to the N-type diffusion layer 7 through the N-type diffusion layer 8. On the other hand, the back gate potential is applied to the P-type diffusion layer 9 through the P-type diffusion layers 10. Namely, the reverse bias is applied to the PN junction region 18 as in the case of the PN junction region 17. It is noted that the PN junction region 18 of the present embodiment corresponds to "a second junction region" of the present invention. Moreover, there may be a case where a junction region of the N-type epitaxial layer 3 and the P-type diffusion layer 9 is used as the "second junction region" in connection with a structure where neither the P-type diffusion layer 6 nor the N-type diffusion layer 7 is formed.

This structure causes the reverse bias to be applied to the PN junction regions 17 and 18 under substantially the same condition. Then, for example, an overvoltage, which is generated when an L load such as a motor load is turned off, is applied between the source and the drain of the LDMOS transistor 1 through the drain region. In this case, the PN junction region 17 is broken down before the PN junction region 18 breaks down, thereby making it possible to prevent the LDMOS transistor 1 from being destroyed. Although described in detail later, in the present embodiment, impurity concentrations of the N-type buried diffusion layer 4 and the P-type buried diffusion layer 5 are decided such that a breakdown voltage of the PN junction region 17 is lower than a breakdown voltage of the PN junction region 18 (breakdown voltage between the source and the drain). Namely, the P-type buried diffusion layer 5 with a high impurity concentration is formed on the upper surface of the N-type buried diffusion layer 4, thereby narrowing an expanding region of a depletion layer. Additionally, as illustrated in the figure, the P-type buried diffusion layer 5 is also formed on the lower surface of the N-type buried diffusion layer 4 depending on the impurity concentration, diffusion conditions, etc., of the P-type buried diffusion layer 5. However, the impurity concentration of the P-type buried diffusion layer 5 positioned at the lower surface of the N-type buried diffusion layer 4 is low and the breakdown voltage of the PN junction area positioned at the lower surface of the N-type buried diffusion layer 4 is higher than the breakdown voltage of the PN junction region 18.

An explanation will be given of each of the cases where the overvoltage is applied to the LDMOS transistor having an overvoltage protection structure and the LDMOS transistor having no overvoltage protection structure.

FIG. 2A illustrates one region of the LDMOS transistor illustrated in FIG. 1. As described above, the PN junction region 17 of the N-type buried diffusion layer 4 and the P-type buried diffusion layer 5 is formed. The formation of the PN junction region 17 implements the overvoltage protection structure. On the other hand, FIG. 2B illustrates the same structure as that of FIG. 2A excepting that the P-type buried diffusion layer 5 and the P-type diffusion layer 6 are not formed. Namely, since the structure of FIG. 2B has no PN junction region 17, the overvoltage protection structure is not implemented. Additionally, in FIGS. 2A and 2B, the same reference numerals as those of FIG. 1 are added to the same structural components as those of FIG. 1.

As illustrated in FIGS. 3A and 3B, when the overvoltage is applied to the LDMOS transistor, an impact ionization occurs in an region, which is surrounded by a solid line and shown by hatching.

First of all, in the structure illustrated in FIG. 3A, the impact ionization occurs in the PN junction region 17 and its neighborhood region, and a maximum breakdown current flows therethrough. On the other hand, in the structure illustrated in FIG. 3B, the impact ionization occurs in the PN junction region 18 of the N-type diffusion layer 7 and the P-type diffusion layer 9 and its neighborhood region, and a maximum breakdown current flows therethrough.

In the structure having no PN junction region 17 illustrated in FIG. 3B, the PN junction region 18 between the source and the drain of the LDMOS transistor breaks down by this phenomenon. Then, the breakdown current occurs concentratedly in the vicinity of the surface of the PN junction region 18. Accordingly, the PN junction region 18 is destroyed by a concentration of the breakdown current and a heat generation caused by the concentration, so that the LDMOS transistor itself is destroyed.

On the other hand, in the structure having the PN junction region 17 illustrated in FIG. 3A, the PN junction region 17 breaks down prior to the PN junction region 18. Then, the breakdown current occurs over a wide range of the PN junction region 17. This structure relaxes the concentration of the breakdown current on the PN junction region 17 to make it hard to destroy the PN junction region 17 by the breakdown current. Then, a generation of the maximum breakdown current in the PN junction region 18 and its neighborhood region is suppressed, thereby making it possible to implement the structure in which the LDMOS transistor itself is not likely to be destroyed.

In other words, the P-type buried diffusion layer 5 and the P-type diffusion layer 6 are formed on the upper surface of the N-type buried diffusion layer 4. This structure does not degrade a withstand voltage characteristic of the LDMOS transistor 1 by a known publicly RESURF principle even if the N-type buried diffusion layer 4 is formed at the lower portion of the LDMOS transistor 1. As a result, the N-type buried diffusion layer 4 can be widely formed at the lower portion of the LDMOS transistor 1. Then, even if the N-type buried diffusion layer 4 is widely formed, the aforementioned overvoltage protection structure can be implemented without increasing an inactive region where no element is formed in an actual operational region.

Moreover, as illustrated in FIG. 3A, the breakdown current flows into the P-type diffusion layer 9 as the back gate region in the structure having the PN junction region 17. In the present embodiment, the P-type buried diffusion layer 5 is formed such that the P-type buried diffusion layer 5 with the high impurity concentration is led from the upper surface of the N-type buried diffusion layer 4. This structure makes it possible to prevent the breakdown current from flowing into the substrate 2 from the N-type buried diffusion layer 4. Then, the breakdown current flows between the P-type diffusion layer 10 and the N-type diffusion layer 12 using the PN junction region 17 as a current path. As a result, it is possible to prevent a change of a substrate potential caused by flowing the breakdown current, for example, an increase in a potential from a ground state. Then, the substrate 2 is shared and elements formed in the other regions can be prevented from being erroneously operated by the increase in the substrate potential and a latch-up phenomenon can be prevented.

More specifically, in FIG. 4, BVds of the LDMOS transistor is designed to 40(V), a solid line illustrates a case in which the overvoltage protection structure is provided (FIG. 2A), and a dotted line illustrates a case in which no overvoltage protection structure is provided (FIG. 2B). In the structure illustrated by the solid line, since the PN junction region 17 is designed such that the breakdown voltage reaches about 30 (V), a voltage of about 30 (V) or more is not applied between the source and the drain. On the other hand, in the structure illustrated by the dotted line, a voltage of about 38 (V) is applied between the source and the drain, and a breakdown occurs in the PN junction region 18. As mentioned above, the PN junction region 17 is provided as the overvoltage protection structure, making it possible to implement the structure in which the LDMOS transistor is not likely to be destroyed even if the overvoltage is applied thereto.

Additionally, it is possible to make an arbitrary design change for the breakdown voltage of the PN junction region 17 by an adjustment of the impurity concentrations of the N-type buried diffusion layer 4 and the P-type buried diffusion layer 5 and diffusion widths of the N-type buried diffusion layer 4 and the P-type buried diffusion layer 5. Then, when the breakdown voltage of the PN junction region 17 is reduced too much, a current capability of the LDMOS transistor deteriorates in some cases. For this reason, the breakdown voltage of the PN junction region 17 can be set to a desired range with consideration given to the element characteristic.

As illustrated in FIG. 5, the present embodiment can be applied also to a structure in which the drain region and the back gate region are alternately and repeatedly formed. Additionally, in this case, the same reference numerals as those of FIG. 1 are added to the same structural components as those of FIG. 1.

As described above FIG. 1, the N-type epitaxial layer 3 is deposited on the upper surface of the P-type single crystal silicon substrate 2. The N-type buried diffusion layer 4 is formed on the substrate 2 and the epitaxial layer 3. The P-type buried diffusion layer 5 is formed on both the upper and lower portions of the N-type buried diffusion layer 4 to form the PN junction region 17. In the epitaxial layer 3, there is formed the P-diffusion layer 6 to be connected to the P-type buried diffusion layer 5. The N-type diffusion layer 7, which is used as the drain region, and the P-type diffusion layer 9, which is used as the back gate region, are alternately and repeatedly formed on the P-type diffusion layer 6. In the P-type diffusion layer 9, the P-type diffusion layer 10, which is used as the back gate leading region, is formed, and the N-type diffusion layer 11, which is used as the source region, is formed therein. This structure forms the PN junction region 18 of the N-type diffusion layer 7 and the P-type diffusion layer 9 between the source and the drain. Then, the N-type diffusion layer 12 to which the drain potential is applied is formed on the epitaxial layer 3 between the P-type diffusion layer 6 and the isolation region 15.

In the present embodiment, the PN junction region 17 can be formed as the overvoltage protection structure even in the structure in which the drain region and the back gate region are repeatedly formed. Then, above the N-type buried diffusion layer 4, the P-type buried diffusion layer 5 and the P-type diffusion layer 6 are formed to be connected to each other. This structure forms the N-type buried diffusion layer 4 integrally over the region divided by the isolation region 15 without degrading the withstand voltage characteristic of the LDMOS transistor as known in the known RESURF principle. Namely, the N-type buried diffusion layer 4 can be efficiently arranged on the element forming region, thereby making it possible to prevent a destruction of the LDMOS transistor while preventing a destruction of the PN junction region 17. Particularly, when the N-type buried diffusion layer 4 is formed in a wide element forming region, there can be obtained a structure in which the PN junction region 17 is not likely to be destroyed as in the structure in which the drain region and the back gate region are alternately and repeatedly formed.

Furthermore, the present embodiment was explained using the structure in which the P-type buried diffusion layer 5 was integrally formed on the upper surface of the N-type buried diffusion layer 4. However, the present embodiment is not limited to this structure. There may be a case where multiple P-type buried diffusion layers 5 are formed on the upper surface of the N-type buried diffusion layer 4 so as to be positioned at the lower portion of the P-type diffusion layer 9 serving as the current path for the breakdown current as illustrated in FIG. 3A.

Additionally, the present embodiment explained the case in which the P-type diffusion layer where the drain region and the back gate region were formed was connected to the P-type buried diffusion layer. However, the present embodiment does not have to be limited to this case. For example, a diffusion layer where the potential is applied to the P-type buried diffusion layer is formed, thereby making it possible to form the PN junction region as the overvoltage protection structure. Furthermore, various modifications may be possible without departing the gist of the embodiment of the present invention.

A detailed explanation is next given of a semiconductor device manufacturing method according to one embodiment of the present invention with reference to FIGS. 6 to 11. Additionally, in the following explanation, the same reference numerals as those explained in the semiconductor device shown in FIG. 1 are added to the same structural components as those of FIG. 1.

FIGS. 6 to 11 are cross sectional views each explaining the semiconductor device manufacturing method according to the present embodiment. Additionally, the following explanation is given of the case in which, for example, the N-channel MOS transistor is formed in one element forming region divided by the isolation region. However, the present embodiment is not limited to this case. For example, there may be a case in which a P-channel MOS transistor, an NPN-type transistor, a vertical PNP transistor are formed in the other element forming region to form a semiconductor integrated circuit device.

Figure 6:
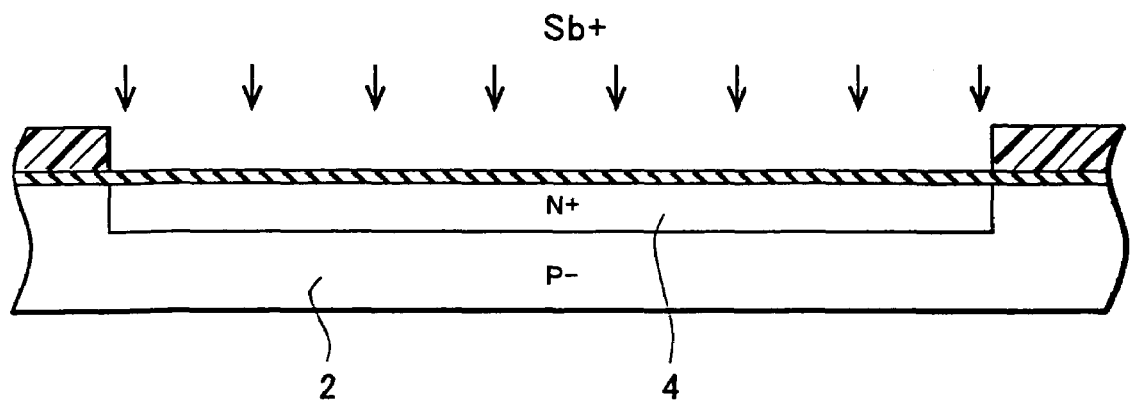
FIG. 6 is a cross sectional view explaining a semiconductor manufacturing method according to an embodiment of the present invention.

First of all, as illustrated in FIG. 6, a P-type single crystal silicon substrate 2 is prepared. N-type impurities such as an antimony (Sb) are ion implanted from a surface of the substrate 2 into a region where an N-type buried diffusion layer 4 is formed using a known photolithographic technique. Then, the ion-implanted impurities are diffused after removing a photoresist therefrom.

Figure 7:
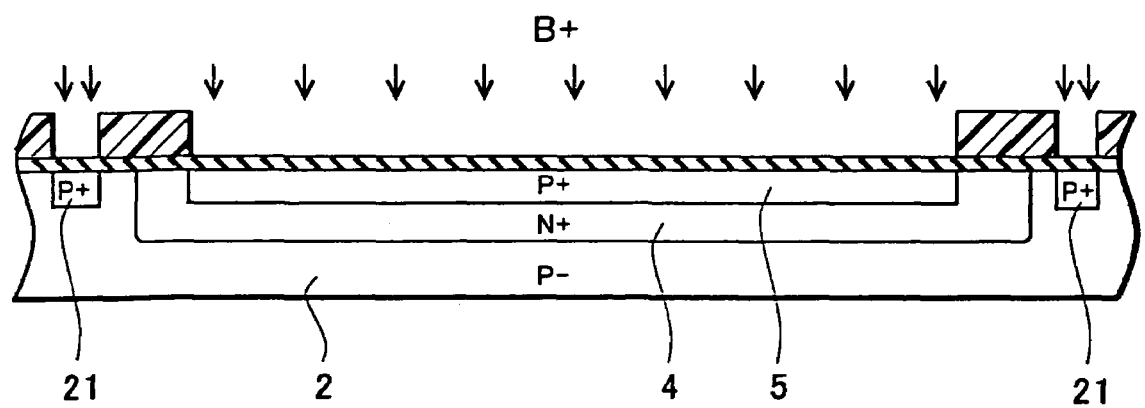
FIG. 7 is a cross sectional view explaining the semiconductor manufacturing method according to the embodiment of the present invention.

Next, as illustrated in FIG. 7, P-type impurities such as a boron (B) are ion implanted from the surface of the substrate 2 into a region where a P-type buried diffusion layer 5 and a buried diffusion layer 21 of an isolation region 15 are formed using the known photolithographic technique. Then, the ion-implanted impurities are diffused after removing a photoresist therefrom.

Figure 8:
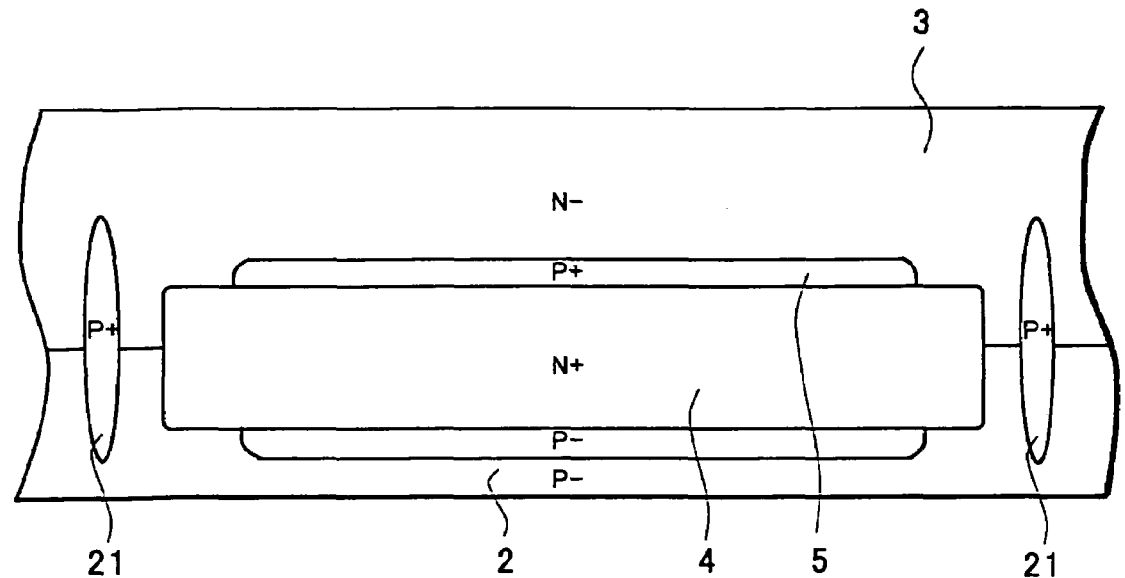
FIG. 8 is a cross sectional view explaining the semiconductor manufacturing method according to the embodiment of the present invention.

Next, as illustrated in FIG. 8, the substrate 2 is placed on a susceptor of an epitaxial growth device. Then, the substrate 2 is heated to, for example, about 1200° C., by a lamp annealing and a $SiHCl_3$ gas and a $H_2$ gas are introduced into a reaction tube. An epitaxial layer 3 with, for example, a specific resistance of 0.1 to 2.0 $\Omega\text{-cm}^2$ and a thickness of about 0.5 to 1.5 µm is grown on the substrate 2 by this process. The impurities introduced into the N-type buried diffusion layer 4, the P-type buried diffusion layer 5, and the P-type buried diffusion layer 21 are diffused to the epitaxial layer 3 by this process. Moreover, since a diffusion coefficient of the boron (B) is higher than that of the antimony (Sb), the P-type buried diffusion layer 5 is led to upper and lower surfaces of the N-type buried diffusion layer 4.

Figure 9:
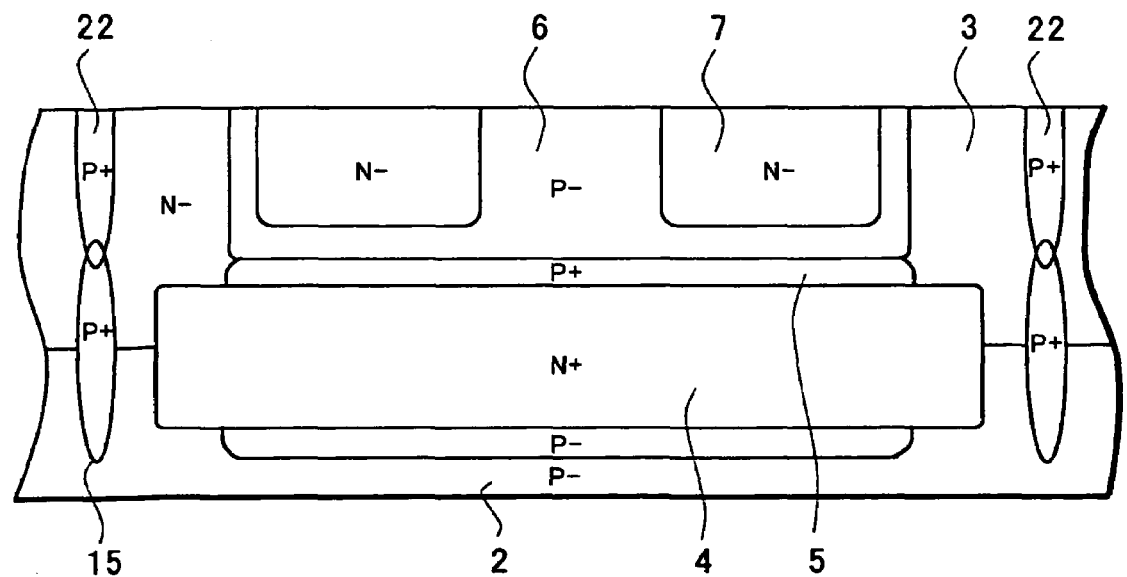
FIG. 9 is a cross sectional view explaining the semiconductor manufacturing method according to the embodiment of the present invention.

Next, as illustrated in FIG. 9, a P-type diffusion layer 6, a N-type diffusion layer 7 and a diffusion layer 22 of the isolation layer 15 are formed from the surface epitaxial layer 3 by the known photolithographic technique. In this process, the P-type diffusion layer 6 is formed to be connected to the P-type buried diffusion layer 5.

Figure 10:
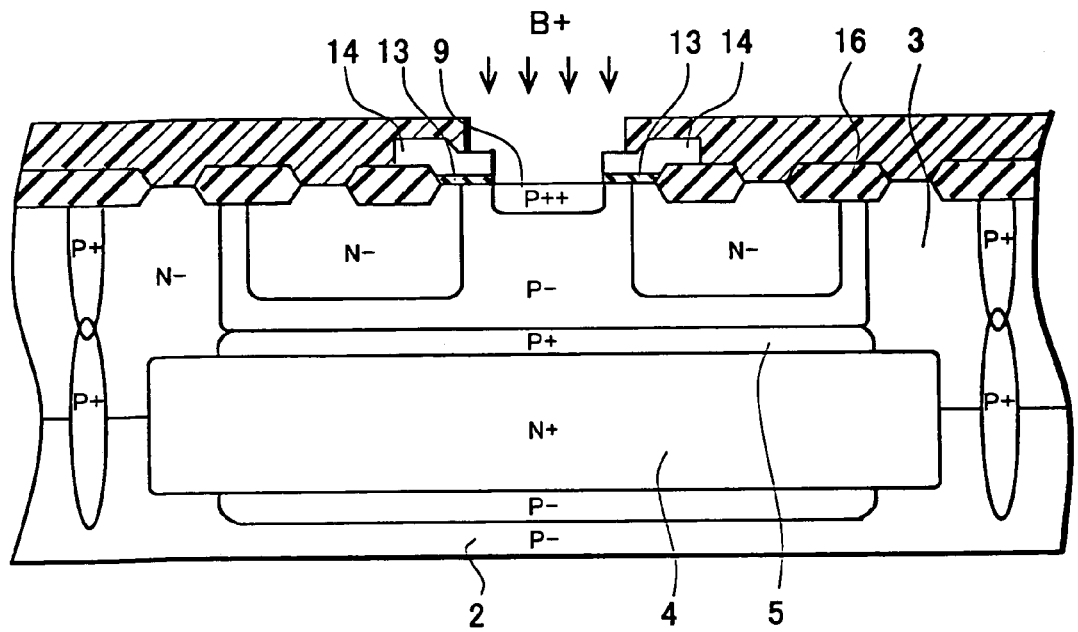
FIG. 10 is a cross sectional view explaining the semiconductor manufacturing method according to the embodiment of the present invention.

Next, as illustrated in FIG. 10, the entire substrate 2 undergoes a heat treatment to form a LOCOS oxide film 16 on a desired region of the epitaxial layer 3. Then, a silicon oxide film, a polysilicon film, and a tungsten silicon film are deposited on the surface of the epitaxial layer 3. The silicon oxide film, the polysilicon film, and the tungsten silicon film are selectively removed therefrom to form a gate oxide film 13 and a gate electrode 14 by the known photolithographic technique.

After that, P-type impurities such as a boron (B) are ion implanted from the surface of the epitaxial layer 3 into a region where a P-type diffusion layer 9 is formed using the known photolithographic technique. Then, the ion-implanted impurities are diffused after removing a photoresist therefrom. In this process, one end side of the gate electrode 14 is used to form the P-type diffusion layer 9 by a self aligning technique.

Figure 11:
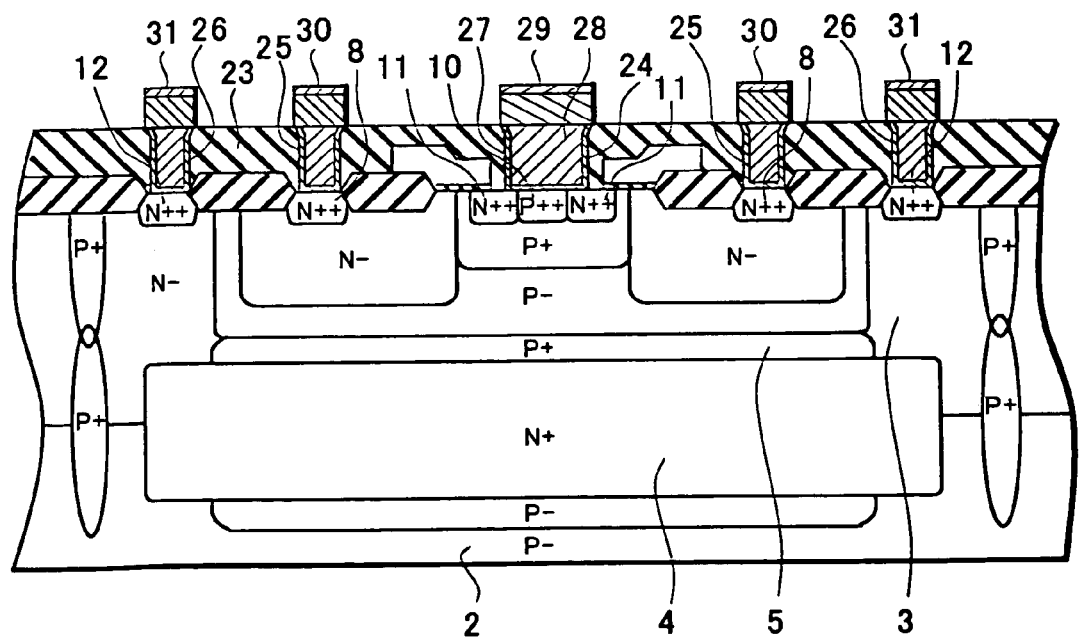
FIG. 11 is a cross sectional view explaining the semiconductor manufacturing method according to the embodiment of the present invention.

Finally, as illustrated in FIG. 11, N-type diffusion layers 8, 11, 12 and a P-type diffusion layer 10 are formed from the surface of the epitaxial layer 3 using the known photolithographic technique. After that, for example, a BPSG film, a SOG film or the like as an insulating layer 23 is deposited on the epitaxial layer 3. Then, contact holes 24, 25, and 26 are formed on the insulating layer 23 by, for example, a dry etching using a $CHF_3+O_2$ gas using the known photolithographic technique.

Next, a barrier metal film 27 is formed on inner walls of the contact holes 24, 25, and 26. After that, interiors of the contact holes 24, 25, and 26 are buried with a tungsten (W) film 28. Then, an aluminum-copper (AlCu) film and a barrier metal film are deposited on an upper surface of the tungsten (W) film 28 by a CVD method. Thereafter, the AlCu film and the barrier metal film are selectively removed therefrom to form a source electrode 29 and a drain electrode 30 using the known photolithographic technique. In the cross-section shown in FIG. 11, a wiring layer extending to the gate electrode is not illustrated, but a connection to the wiring layer is established in the other region. Furthermore, although not illustrated in the figure, an electrode 31 formed on the N-type diffusion layer 12 is electrically connected to have an equal potential to that of the drain electrode 30.

As described above, in the present embodiment, a forming condition of the P-type buried diffusion layer 5 is decided based on a condition under which a PN junction region 17 is formed on the upper surface of the N-type buried diffusion layer 4. This manufacturing method can implement a structure that prevents the breakdown current from flowing into the substrate 2 when the overvoltage is applied to an LDMOS transistor 1. Then, this makes it possible to prevent erroneous operations of the other elements formed on the same substrate by the increase in the substrate potential and the latch-up phenomenon.

Furthermore, the P-type buried diffusion layer 5 that forms the PN junction region 17 can be formed in a process shared with the buried diffusion layer 21 of the isolation region 15. This eliminates a need for using a dedicated mask for forming the PN junction region 17 to make it possible to prevent an increase in a manufacturing cost.

In the embodiment of the present invention, a N-type buried diffusion layer and a P-type buried diffusion layer are overlapped on each other to form a PN junction region for an element protection below a region where an MOS transistor is formed. A breakdown voltage of the PN junction region is set so as to be lower than a breakdown voltage between a drain and a source of the MOS transistor. This structure makes it possible to prevent the MOS transistor from being destroyed by the overvoltage.

Moreover, in the embodiment of the present invention, the PN junction region for the element protection is formed on an upper surface of the N-type buried diffusion layer in a wide range. This structure diffuses the breakdown current in the PN junction region to make it possible to prevent the PN junction region from being destroyed.

Furthermore, in the embodiment of the present invention, the P-type buried diffusion layer and the P-type diffusion are formed above the N-type buried diffusion layer over a wide range. This structure makes it possible to form the N-type buried diffusion layer below an element forming region without degrading a device withstand voltage using a known RESRF principle. Then, it is possible to prevent the PN junction region for the element protection from being destroyed by the breakdown current.

Moreover, in the embodiment of the present invention, the PN junction region for the element protection is formed on the upper surface of the N-type buried diffusion layer formed across the semiconductor substrate and the epitaxial layer. This structure makes it possible to prevent a change in an electric potential of the semiconductor substrate by the breakdown current without the breakdown current flowing into the semiconductor substrate.

Furthermore, in the embodiment of the present invention, the P-type buried diffusion layer and the P-type diffusion layer are connected to each other, and a drain potential is applied to the P-type buried diffusion layer which forms the PN junction region for the element protection. This structure eliminates a need for forming a P-type diffusion layer for applying a potential to the P-type buried diffusion layer to make it possible to realize a miniaturization of an element size.

Moreover, in the embodiment of the present invention, the drain potential is applied to the N-type buried diffusion layer where the PN junction region for the element protection is formed, and a back gate potential (source potential) is applied to the P-type buried diffusion layer. This structure makes it possible to apart a current path for the breakdown current from a current path between the source and the drain from each other. Then, the current path for the device is protected, thereby making it possible to prevent the deterioration of an element characteristic.

What is claimed is:

1. A semiconductor device comprising:
a semiconductor substrate of one conductivity type;
an epitaxial layer of an opposite conductivity type formed on the semiconductor substrate;
a buried diffusion layer of an opposite conductivity type formed across the semiconductor substrate and the epitaxial layer;
a buried diffusion layer of one conductivity type, which is formed on the buried diffusion layer of the opposite conductivity type and which has a first junction region with the buried diffusion layer of the opposite conductivity type;
a first diffusion layer of one conductivity type, which is formed in the epitaxial layer and which is used as a back gate region;
a first diffusion layer of an opposite conductivity type, which is formed in the first diffusion layer of the one conductivity type and which is used as a source region:
a gate oxide film and a gate electrode formed on the epitaxial layer;
a second diffusion layer of an opposite conductivity type, which is formed in the epitaxial layer, which is used as a drain region, and which has a second junction region with the first diffusion layer of the one conductivity type; and
a third diffusion layer of an opposite conductivity type, which is formed in the epitaxial layer and which is electrically connected to the second diffusion layer of the opposite conductivity type above the epitaxial layer,
wherein a breakdown voltage of the first junction region is lower than that of the second junction region.

2. The semiconductor device according to claim 1, wherein a second diffusion layer of one conductivity type connected to the buried diffusion layer of the one conductivity type is formed in the epitaxial layer.

3. The semiconductor device according to claim 2, wherein the first diffusion layer of the one conductivity type and the second diffusion layer of the opposite conductivity type are formed in the second diffusion layer of the one conductivity type.

4. The semiconductor device according to claim 3, wherein the first diffusion layer of the one conductivity type and the second diffusion layer of the opposite conductivity type are alternately and repeatedly formed on the second diffusion layer of the one conductivity type.

* * * * *